United States Patent
Isobe

(10) Patent No.: US 7,183,820 B2
(45) Date of Patent: Feb. 27, 2007

(54) PHASE SYNCHRONOUS CIRCUIT

(75) Inventor: Yoshihisa Isobe, Kanagawa (JP)

(73) Assignee: NEC Electronics Corporation, Kanagawa (JP)

( * ) Notice: Subject to any disclaimer, the term of this patent is extended or adjusted under 35 U.S.C. 154(b) by 0 days.

(21) Appl. No.: 11/134,271

(22) Filed: May 23, 2005

(65) Prior Publication Data

US 2005/0264327 A1  Dec. 1, 2005

(30) Foreign Application Priority Data

May 25, 2004  (JP)  .............................. 2004-154449

(51) Int. Cl.
*H03L 7/00*  (2006.01)
(52) U.S. Cl. ...................... 327/141; 327/144
(58) Field of Classification Search ...................... None
See application file for complete search history.

(56) References Cited

U.S. PATENT DOCUMENTS 6,002,731 A * 12/1999 Aoki et al. .................. 375/371
6,373,911 B1 * 4/2002 Tajima et al. ................ 375/375
6,876,710 B1 * 4/2005 Pitzer et al. ................. 375/371
6,987,825 B1 * 1/2006 Yoshimura et al. ......... 375/371

FOREIGN PATENT DOCUMENTS

JP  2000-315944  11/2000
JP  2001-351381  12/2001

* cited by examiner

*Primary Examiner*—Timothy P. Callahan
*Assistant Examiner*—Cassandra Cox
(74) *Attorney, Agent, or Firm*—McGinn IP Law Group, PLLC

(57) ABSTRACT

According to an aspect of the invention, there is provided a phase synchronous circuit generating an output signal synchronized with an input signal. The phase synchronous circuit comprises an output circuit putting out an output signal according to an input clock signal, a selection circuit selecting a clock signal applied to the output circuit from multiphase clock signals such that the output circuit puts out an output signal synchronized with the input signal. The internal delay in a phase synchronous circuit using a multiphase clock signal can be efficiently compensated and an output signal synchronized with the reference signal can be generated.

15 Claims, 13 Drawing Sheets

RELATED ART

PHASE SYNCHRONOUS CIRCUIT

BACKGROUND OF THE INVENTION

1. Field of the Invention

The present invention relates to a phase synchronous circuit, and more particularly to a phase synchronous circuit for selecting a signal from multiphase clock signals and outputting a signal synchronized in phase with a reference signal.

2. Description of Related Art

Most electronic apparatuses use circuits generating signals synchronized with reference signals. For example, in computers, a circuit for selecting and outputting a clock signal with a prescribed frequency from a generator according to a reference signal is used to generate a clock signal supplied to a CPU or chip set. PLL (Phase-Locked Loop) or DLL (Delay-Locked Loop) method have been suggested as methods for phase synchronization with a reference signal, in particular as methods for phase synchronization with a periodic reference signal.

A phase synchronous circuit according to the related technique is disclosed, for example, in Japanese Patent Application Laid-open No. 2001-351381. This document discloses a phase synchronous circuit for synchronization with a reference signal serving as a periodic signal. FIG. 13 is a circuit diagram illustrating a general configuration of the phase synchronous circuit according to the related technique. The phase synchronous circuit shown in FIG. 13 is a DLL feedback circuit and puts out an output signal DOUT in phase with an EXCLK. Further, the phase synchronous circuit comprises a phase comparator 710, a delay control circuit 720, a variable delay circuit 730, and a replica delay circuit 740.

The operation of the phase synchronous circuit will be explained below. The phase comparator 710 compares the phases of a reference clock signal EXCLK and a recovery clock signal RCLK and outputs a signal corresponding to the comparison result to the delay control circuit 720. The delay control circuit 720 controls the delay of the variable delay circuit 730 according to the comparison results of the phase comparator 710 so that the phases thereof coincide.

The output from the variable delay circuit 730 is outputted as an output signal DOUT to the outside via a data output control circuit 750. A delay is generated in the data output control circuit 750 between the output timing of the variable delay circuit 730 and the output timing of the output signal DOUT. A replica delay circuit 740 is connected between the data output control circuit 750 and phase comparator 710 such that the phases of the reference signal EXCLK and output signal DOUT coincide.

The delay time of the replica delay circuit 740 is equal to the delay time in the data output control circuit 750 and the phases of the reference signal EXCLK and output signal DOUT can coincide. Typically, the replica delay circuit 740 has a circuit configuration identical to that of data output control circuit 750 in order to reduce the delay error relative to the data output control circuit 750 caused by manufacturing variations or usage conditions.

FIG. 14 is a timing chart illustrating changes with time of the reference clock signal EXCLK, replica clock signal RCLK, output signal CLK2 of the variable delay circuit 730, and output signal DOUT. As shown in FIG. 14, because the phases of EXCLK and RCLK coincide, CLK2 corresponding to the input signal of the replica delay circuit 740 is a leading clock that leads in phase the EXCLK by the delay time of the replica delay circuit 740. Further, as described hereinabove, the delay time of the data output control circuit 750 is equal to the delay time of the replica delay circuit 740. Therefore, the phase of DOUT generated by the data output control circuit 750 from CLK2 is synchronized with the phase of EXCLK.

In the phase synchronization approach of circuits illustrated by FIG. 13, the internal delay is cancelled by matching the phases of the signal RCLK after the replica delay and the input reference signal EXCLK and driving the output circuit by using the signal CLK2 before the replica delay as a trigger.

On the other hand, Japanese Patent Application Laid-open No. 2000-315944 suggests a synchronized clock signal generator for generating a synchronized clock signal by generating a plurality of clock signals with different phases and selecting a clock signal with the minimum shift in timing with respect to the reference signal. Such a synchronized clock signal generator is used for generating synchronization signals for printers. In order to generate a plurality of clock signals with different phases, first, the generator generates a clock signal at a regular bit rate frequency. This clock signal is delayed by multiple stage buffers, and each buffer outputs a delay signal with different delay time. As a result, a plurality of clock signals with different phases are generated.

Further, the output signal of a beam detector is inputted as a reference signal. The timing of the reference signal and the output timing of each buffer are compared and a clock signal closest to the timing of the reference signal is selected. The selected clock signal is outputted as a synchronized clock signal synchronized with the reference signal. As a result, a synchronized clock signal generation apparatus using a generator with a comparatively low frequency can be obtained and circuit design can be facilitated.

The DLL circuit disclosed in Japanese Patent Application Laid-open No. 2001-351381 can generate a signal that is synchronized in phase with a periodic reference signal. However, when the reference signal is a nonperiodic signal and inputted randomly, phase synchronization with a feedback circuit such as DLL cannot be conducted. On the other hand, with the synchronized clock signal generation apparatus disclosed in Japanese Patent Application Laid-open No. 2000-315944, a signal synchronized in phase with a reference signal can be generated even when the reference signal is a nonperiodic signal by selecting a clock signal from multiphase clock signals with different phases correspondingly to the reference signal.

However, the delay in internal circuits in phase synchronization between a reference signal and multiphase clock signals has not yet been studied. For this reason, when a delay caused by the internal circuits is produced with respect to the reference signal or multiphase clock signal, an output signal synchronized with the reference signal cannot be generated. Therefore, phase synchronous circuits using multiphase clock signals are required to have a configuration which compensates for the internal delay with a necessary accuracy. Furthermore, the reduction of circuit area and power consumption is constantly required for semiconductor circuit devices. Therefore, it is desirable that the internal delay be compensated for with an efficient circuit configuration.

SUMMARY OF THE INVENTION

According to an aspect of the invention there is provided a phase synchronous circuit generating an output signal synchronized with an input signal. The phase synchronous circuit comprises an output circuit putting out an output signal according to an input clock signal, a selection circuit selecting a clock signal applied to the output circuit from multiphase clock signals such that the output circuit puts out an output signal synchronized with the input signal.

Thus, the internal delay in a phase synchronous circuit using a multiphase clock signal can be efficiently compensated and an output signal synchronized with the reference signal can be generated.

BRIEF DESCRIPTION OF THE DRAWINGS

The above and other objects, advantages and features of the present invention will be more apparent from the following description taken in conjunction with the accompanying drawings, in which.

DESCRIPTION OF THE PREFERRED EMBODIMENTS

Embodiment 1

Figure 1:
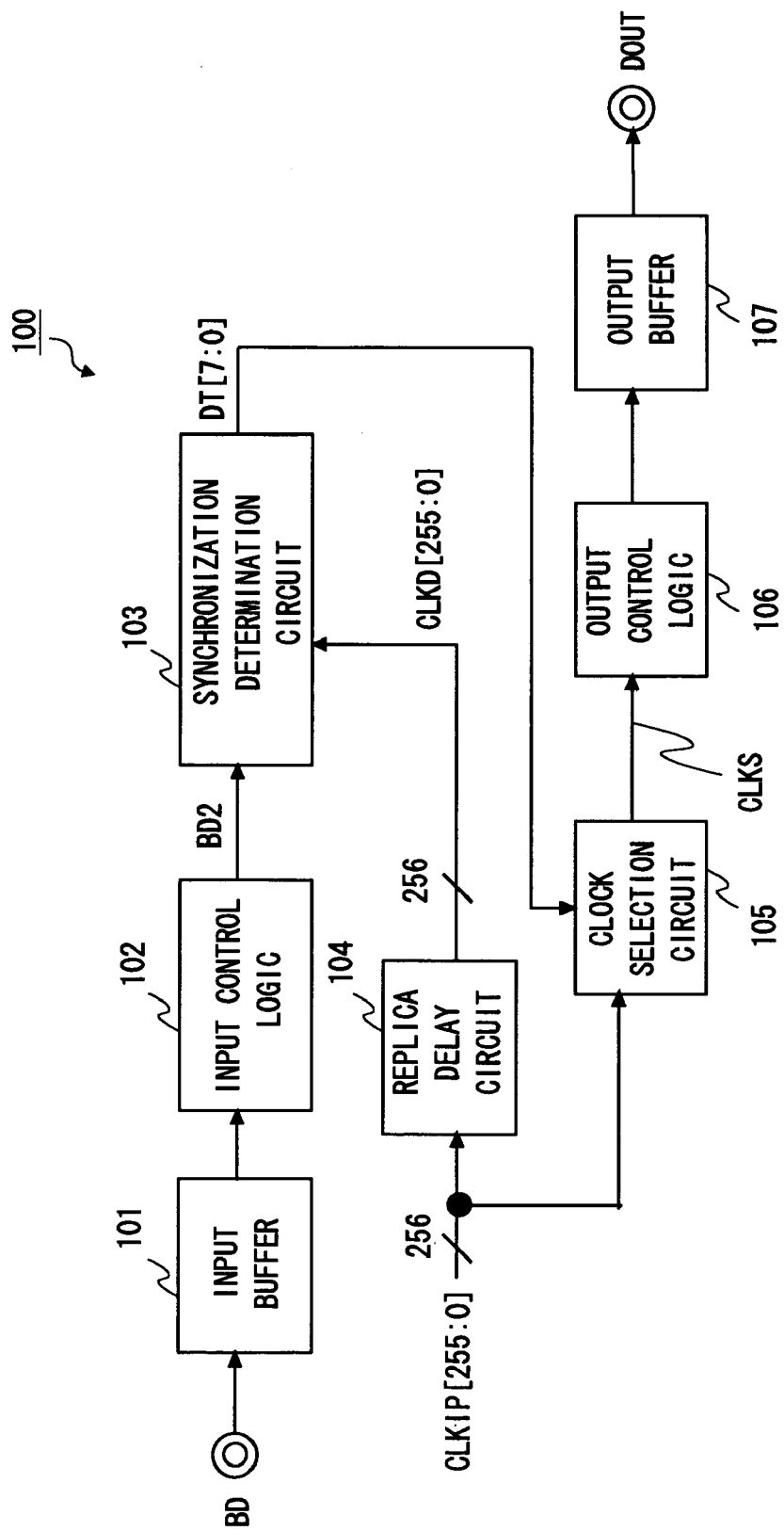
FIG. 1 is a block diagram illustrating a general configuration of a phase synchronous circuit 100 of the first embodiment.
Figure 2:
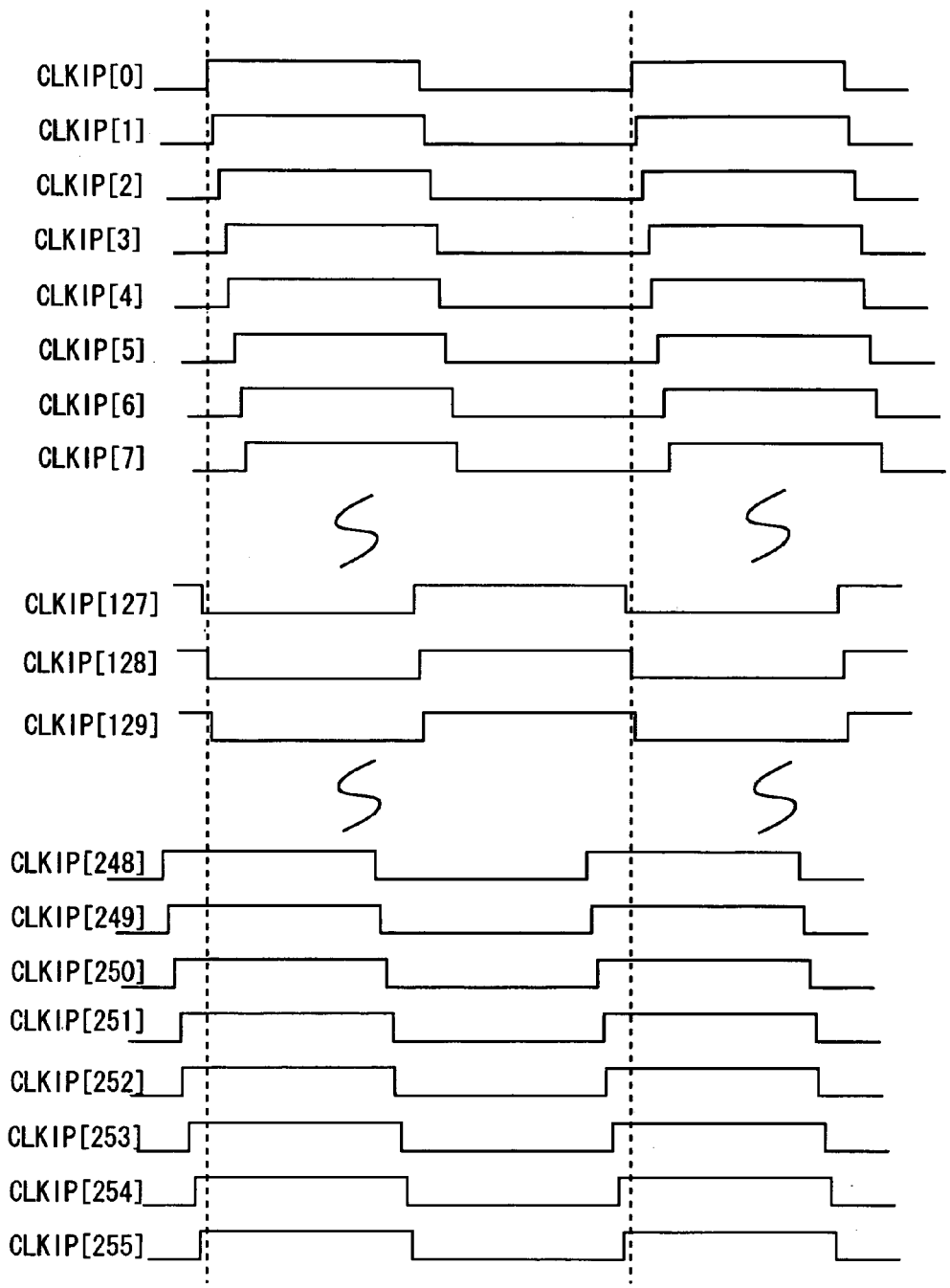
FIG. 2 shows the timing of multiphase clock signals CKLIP in the first embodiment.

FIG. 1 is a block diagram illustrating a general configuration of a phase synchronous circuit 100 according to the present embodiment. Using a multiphase clock signal CKLIP, the phase synchronous circuit 100 generates an output signal DOUT synchronized with an input reference signal BD. The phase synchronous circuit 100 can be used, for example, in circuits for generating synchronization signals of printers. In the present embodiment, the case where the number of phases in the multiphase clock signal CKLIP is 256 will be explained as an example. FIG. 2 shows the timing of the multiphase clock signal CKLIP. Signals with 256 different phases within one period denoted by dotted lines are shown in the figure.

The phase synchronous circuit 100 comprises an input buffer 101 for receiving the reference signal BD and an input control logic 102 as input circuits. The input control logic 102 executes, e.g., a polarity control with respect to the input reference signal. A synchronization determination circuit 103 compares phases of the reference signal and multiphase clock signals and determines the clock signal synchronized with the reference signal (clock signal closest in timing to the reference signal). A replica delay circuit 104 provides the prescribed delay to the multiphase clock signals to compensate for the delay of the reference signal and multiphase clock signal in the internal circuits. The replica delay circuit 104 comprises a total of 256 replica delay elements corresponding to 256 multiphase clock signals. The delay in each internal circuit is compensated for by the delay of the replica delay circuit 104. The delay time of the replica delay circuit 104 will be described below.

The clock selection circuit 105 selects one clock signal from multiphase clock signals based on the determination results of the synchronization determination circuit 103. The phase synchronous circuit 100 further comprises an output circuit for putting out an output signal in accordance with the selected clock signal. In the present example, the output circuit consists of an output control logic 106 and an output buffer 107. The output control logic 106 executes polarity control of the output signal or output level control.

The entire operation of the phase synchronous circuit 100 will be described below. The reference signal BD provided from the outside is applied to the synchronization determination circuit 103 via the input buffer 101 and input control logic 102. The reference signal is delayed by the input buffer 101 and input control logic 102. The reference signal delayed by the input buffer 101 and input control logic 102 is designated by a symbol BD2 in FIG. 1.

On the other hand, 256-phase multiphase clock signals CLKIP are inputted into the synchronization determination circuit 103 via the replica delay circuit 104. The multiphase clock signals CLKIP are delayed by the replica delay circuit 104 and put out as multiphase clock signals CLKD. The synchronization determination circuit 103 determines the clock signal in the multiphase clock signals CLKD that is closest in phase (synchronized) to the reference signal BD2 and outputs an 8-bit signal DT identifying the clock signal that is closest in phase (synchronized).

The clock selection circuit 105 selects one clock signal CLKS from multiphase clock signals CLKIP according to the suffix DT determined by the synchronization determination circuit 103. The selected clock signal CLKS is passed to the output control logic 106. The output control logic 106 puts out an output signal DOUT via the output buffer 107 by using the clock signal CLKS as a trigger.

Figure 3:
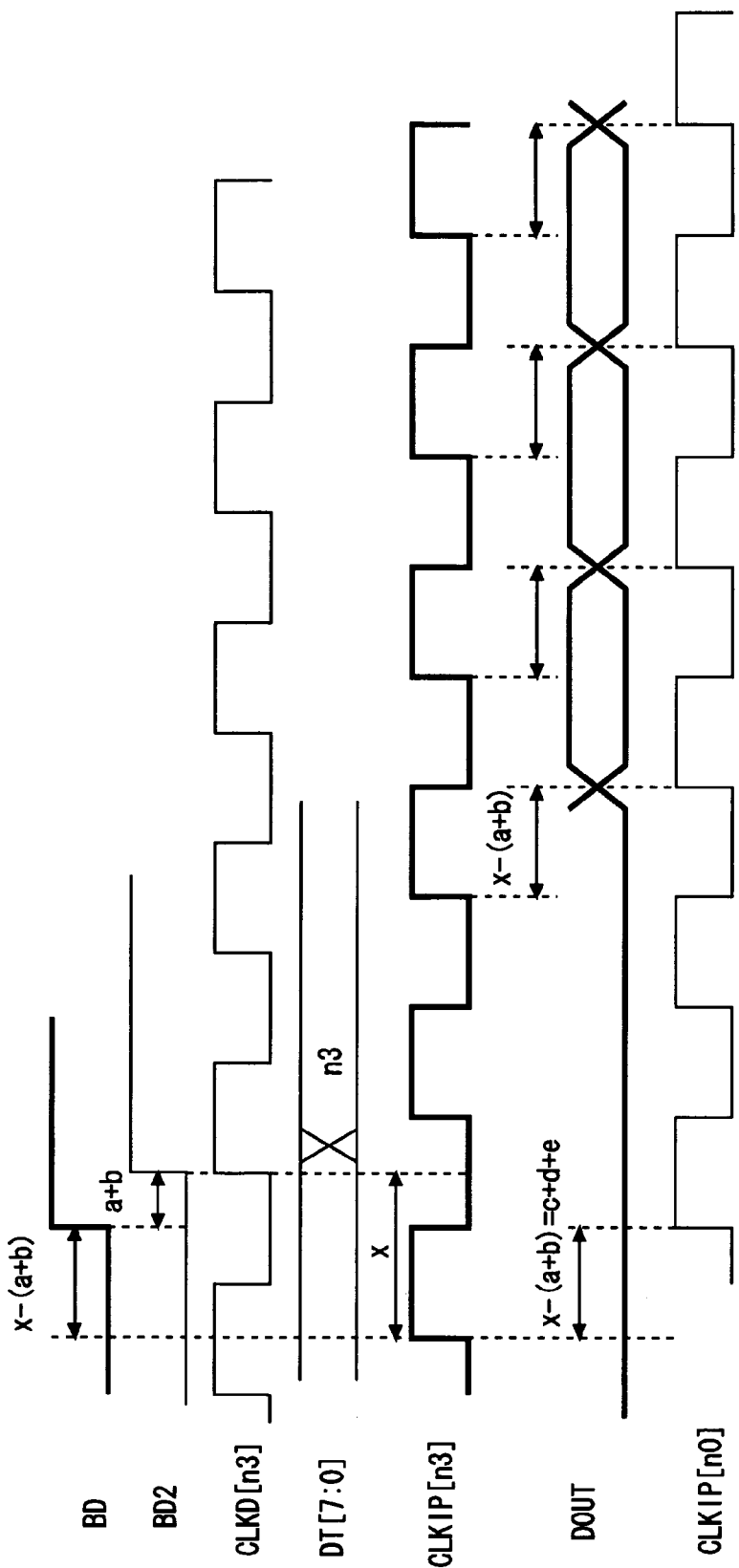
FIG. 3 is a timing chart illustrating timing of each signal in the phase synchronous circuit of the first embodiment.

The timing of each signal in the phase synchronous circuit 100 will be explained below with reference to a timing chart shown in FIG. 3. In FIG. 3, "a" denotes the delay time of the input buffer 101, "b" denotes the delay time of the input control logic 102, "c" denotes the delay time of the clock selection circuit 105, "d" denotes the delay time of the output control logic 106, and "e" denotes the delay time of the output buffer 107. The delay time of the replica delay circuit 104 includes the delay time of each aforementioned internal circuit. The delay time, x, of the replica delay circuit 104 is a sum of the delay times of the five aforementioned circuits, and the following relationship is satisfied: x=(a+b+c+d+e).

Further, in FIG. 3, a clock signal CLKIP[n3] indicated by suffix [n3] is selected from the multiphase clock signals CLKIP. The clock signal delayed by the replica delay circuit 104 and selected by the synchronization determination circuit 103 is indicated by CLKD[n3]. CLKIP[n0] is a virtual clock signal synchronized with the input reference signal BD. Because it is synchronized with the input reference signal BD, the virtual clock signal CLKIP[n0] is also synchronized with the output signal DOUT.

The phase of the output signal DOUT lags the phase of the multiphase clock signal CLKIP by total of the delays of the clock selection circuit 105, output control logic 106, and output buffer 107 (c+d+e). Therefore, in order to output the output signal DOUT synchronized with the input reference signal BD, the phase of the clock signal CLKIP[n3] has to lead the virtual clock signal CLKIP[n0] (output signal DOUT) by the time (c+d+e).

Here, considering the phase difference between the signals (timing shift), the reference signal BD2 delayed by the input circuits 101, 102 is delayed with respect to the inputted reference signal BD by the time (a+b). Because the synchronization determination circuit 103 selects the clock signal synchronized with the reference signal BD2, the clock signal CLKD[n3] is phase synchronized with the reference signal BD2. Since the delay time of the replica delay circuit 104 is x(=a+b+c+d+e), the phase of the clock signal CLKIP[n3] will be advanced by the delay time x with respect to the clock signal CLKD[n3].

On the other hand, the phase of the input reference signal BD leads the reference signal BD2 by the dime (a+b). Therefore, the difference in phase between the clock signal CLKIP[n3] and input reference signal BD can be represented by x−(a+b). In other words, the phase of the clock signal CLKIP[n3] leads the input reference signal BD by the time (x−(a+b))=(c+d+e). Because the input reference signal BD and virtual clock signal CLKIP[n0] are synchronized, the phase of the clock signal CLKIP[n3] leads the virtual clock signal CLKIP[n0] by the time (c+d+e). This result satisfies the above-described required relationship.

As described hereinabove, with the present embodiment, when an internal delay is present, the output signal can be put out synchronized in the phase with the reference signal inputted at a non-periodic timing. The circuit configuration comprising the input and output circuits can be appropriately changed according to the design and is not limited to that described in the present example. For example, the circuit configuration containing no input control circuit is also possible. The same is true for the description below.

Embodiment 2

Figure 4:
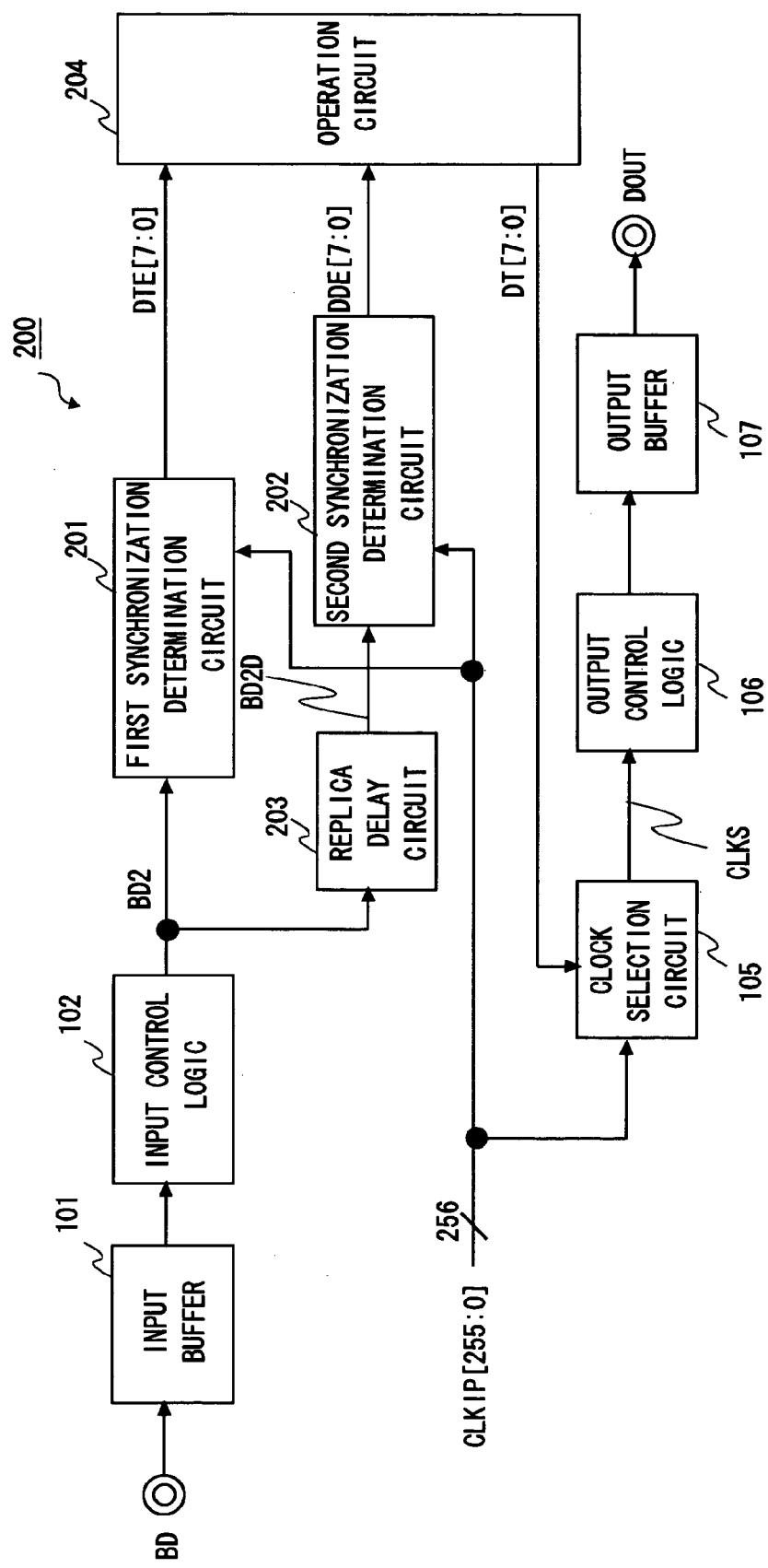
FIG. 4 is a block diagram illustrating a general configuration of a phase synchronous circuit of the second embodiment.

FIG. 4 is a block diagram illustrating a general configuration of a phase synchronous circuit 200 according to the present embodiment. The phase synchronous circuit 200 comprises two different synchronization determination circuits for detecting synchronization of multiphase clock signals and reference signal. Each synchronization determination circuit executes synchronization determination of the reference signal and multiphase clock signals. The reference signal delayed by a replica delay circuit is inputted to one of synchronization determination circuits. A clock signal that has to be selected from the multiphase clock signals can be determined by computation processing from the determination results of each synchronization determination circuit.

Referring to FIG. 4, the phase synchronous circuit 200 comprises a first synchronization determination circuit 201 and a second synchronization determination circuit 202. The first and second synchronization determination circuits 201, 202 compare the phases of the input multiphase clock signals and input reference signal, and select a clock signal closest in phase to the reference signal (synchronized with the reference signal). A reference signal BD2D delayed by a replica delay circuit 203 is inputted into the second synchronization determination circuit 202. The delay caused by each internal circuit is compensated for with the delay of the replica delay circuit 203. The delay time of the replica delay circuit 203 will be described below.

The first and second synchronization determination circuits 201, 202 output a suffix identifying the selected clock signal. In the present example, the suffix is indicated by 8-bit data, the first synchronization determination circuit 201 outputs a suffix DTE, and the second synchronization determination circuit 202 outputs a suffix DDE. A operation circuit 204 determines the clock signal selected from the multiphase clock signals based on the output signals of the first and second synchronization determination circuits 201, 202 and outputs the suffix DT identifying this clock signal to the clock selection circuit 105. The computation processing conducted by the operation circuit 204 will be described below.

The entire operation of the phase synchronous circuit 200 will be explained below. The reference signal BD provided from the outside is applied to the first synchronization determination circuit 201 via the input buffer 101 and input control logic 102. The reference signal delayed by the input buffer 101 and input control logic 102 is indicated by a symbol BD2, in the same manner as shown in FIG. 1. The delayed reference signal BD2 is branched and inputted into the replica delay circuit 203. The reference signal BD2D delayed by the replica delay circuit 203 is inputted into the second synchronization determination circuit 202.

Multiphase clock signals CLKIP are inputted into the first synchronization determination circuit 201 and a clock signal synchronized with the reference signal BD2 is determined from the multiphase clock signals CLKIP. The suffix DTE of the determined clock signal is inputted from the first synchronization determination circuit 201 into the operation circuit 204. The multiphase clock signals CLKIP is also inputted into the second synchronization determination circuit 202 and a clock signal synchronized with the reference signal BD2D is determined from the multiphase clock signals CLKIP. The suffix DDE of the determined clock signal is inputted from the second synchronization determination circuit 202 into the operation circuit 204.

The operation circuit 204 determines the clock signal to be selected from the multiphase clock signals CLKIP based on the DTE and DDE. The suffix DT of the determined clock signal is inputted from the operation circuit 204 into the clock selection circuit 105. The clock selection circuit 105 selects one clock signal CLKS from multiphase clock signals CLKIP according to the DT. The selected clock signal CLKS is inputted into the output control logic 106. The output control logic 106 outputs an output signal DOUT via the output buffer 107 by using the clock signal CLKS as a trigger. As a result, the output signal DOUT synchronized with the inputted synchronization signal BD is outputted.

Figure 5:
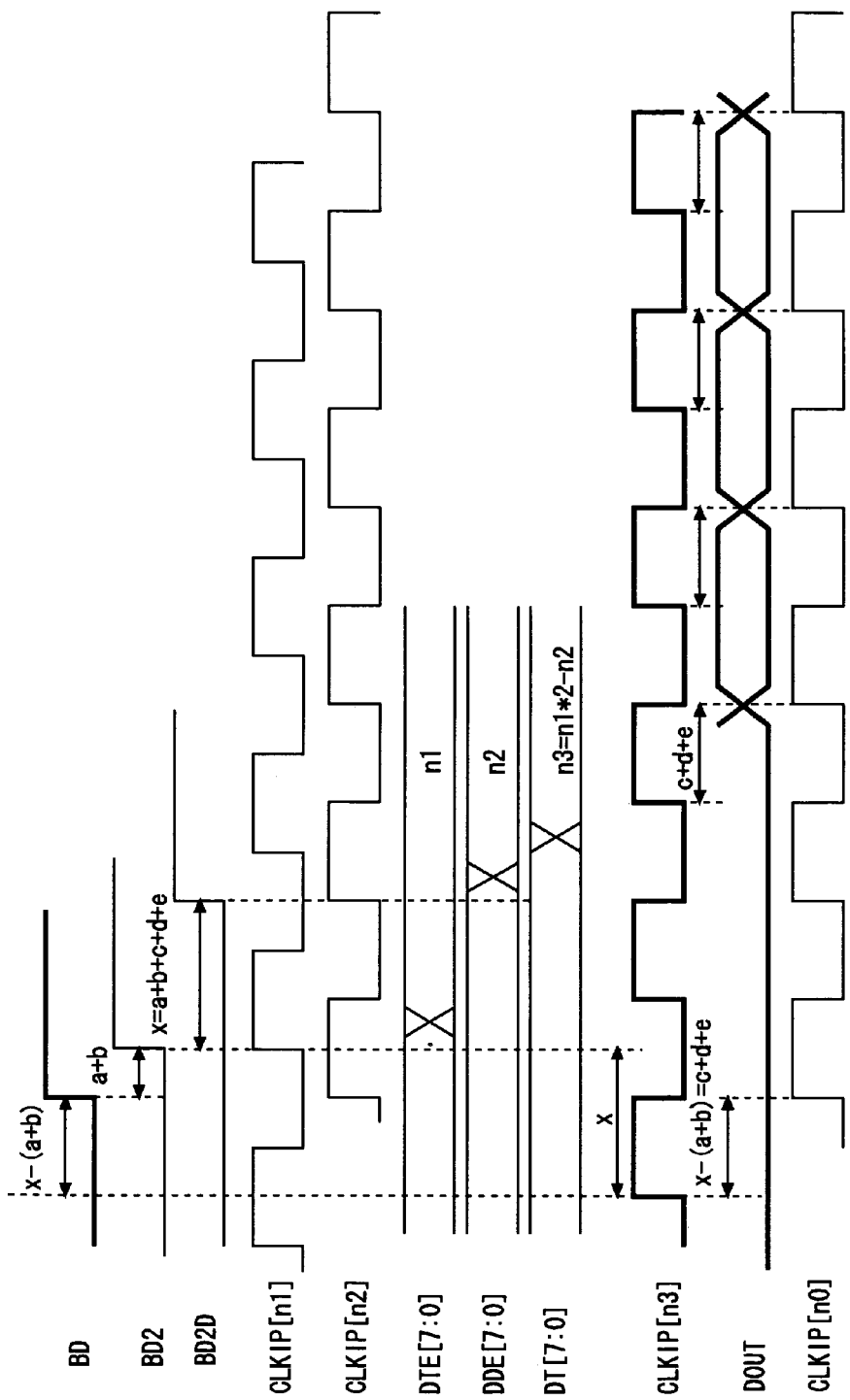
FIG. 5 is a timing chart illustrating the timing of each signal in the phase synchronous circuit of the second embodiment.

The timing of each signal in the phase synchronous circuit 200 will be explained below with reference to the timing chart shown in FIG. 5. CKLIP[n1] is a clock signal determined by the first synchronization determination circuit 201 and CKLIP[n2] is a clock signal determined by the second synchronization determination circuit 202. CKLIP[n3] is a clock signal selected by the clock selection circuit 105. CKLIP [n0] is a virtual clock signal synchronized with the inputted reference signal BD, similarly to Embodiment 1.

The number in square brackets "[ ]" is a suffix identifying the clock signal. The suffix [n3] of the clock signal selected by the clock selection circuit 105 and the suffixes [n1], [n2] of the clock signals selected by the first synchronization determination circuit 201 and second synchronization determination circuit, respectively, satisfy the following relationship: (n3=n1−(n2−n1)=2*n1−n2). In other words, (DT=DTE−(DDE−DTE)). In this computation, the carry is omitted. Each of the delay times a, b, c, d, e is identical to the time shown in FIG. 3. Further, x is the delay time of the replica delay circuit 203 and satisfies the relationship x=(a+b+c+d+e) that includes the delay times of each internal circuit. Thus, each delay of the internal circuits is compensated by the replica delay circuit 203. Further, circuit elements generating the delay vary depending on the circuit configuration, and it goes without saying that the circuit configuration of the present embodiment is not limiting.

The phase of the output signal DOUT has a delay (c+d+e) created by the clock selection circuit 105, output control logic 106, and output buffer 107 with respect to the phase of the multiphase clock signal CLKIP. Therefore, in order to output the output signal DOUT synchronized with the input reference signal BD, the phase of the clock signal CLKIP [n3] has to be advanced by the time (c+d+e) with respect to the virtual clock signal CLKIP[n0] (output signal DOUT).

Here, considering the phase difference between the signals (timing shift), the reference signal BD2 delayed by the input circuits 101, 102 lags the inputted reference signal BD by the time (a+b). The synchronization determination circuit 203 delays the reference signal BD2D by the time x(=(a+b+c+d+e)) with respect to the reference signal BD2. The CKLIP[n1] selected by the first synchronization determination circuit 201 is synchronized with BD2, and the CKLIP [n2] selected by the second synchronization determination circuit 202 is synchronized with BD2D.

The operation circuit 204 can put out the output signal DOUT synchronized with the reference signal BD by determining the DT based on the difference in phase between DTE and DB and on the difference in phase between DDE and DTE. In the present example, the clock signal CLKIP [n3] selected by the operation circuit 204 is determined by (n3=n1−(n2−n1)=2*n1−n2 ). The CKLIP[n3] leads CKLIP [n1] by the time corresponding to the difference in phase between CKLIP[n2] and CKLIP[n1]. Since time of the difference in phase between CKLIP[n2] and CKLIP[n1] is x, the CKLIP[n3] leads by x CKLIP[n1]. CKLIP[n1] is delayed by the time (a+b) with respect to the inputted reference signal BD. Therefore, CKLIP[n3] leads the reference signal BD by the time (c+d+e).

The virtual clock signal CLKIP [n0] is synchronized with the inputted reference signal BD and output signal DOUT. CKLIP[n3] leads the reference signal BD, the virtual clock signal CLKIP[n0] and output signal DOUT by the time (c+d+e). This satisfies the above-described required relationship.

As described above, with the present embodiment, the output signal synchronized with the input reference signal can be generated by using multiphase clock signals. The reference signal is applied to the replica delay circuit and the reference signal is delayed by the predetermined delay time. By contrast with the case where the multiphase clock signals are delayed, it is not necessary to prepare the replica delay elements for each multiphase clock. Therefore, the circuit surface area and current consumption can be reduced. Furthermore, problems associated with the spread of characteristics between the replica delay elements can be avoided.

In the above-described example, the same multiphase clock signals were inputted in the two synchronization determination circuits 201, 202. However, for example, the multiphase clock signals inputted in one of the circuits may be delayed. Furthermore, it is not necessary that the reference signal inputted into the replica delay circuit 203 and the reference signal inputted into the first synchronization determination circuit 201 be synchronized. In those cases, an output signal synchronized with the inputted reference signal can be generated by adequately setting the delay time of the replica delay circuit 203. Those issues are identical for the below-described embodiments.

Figure 6:
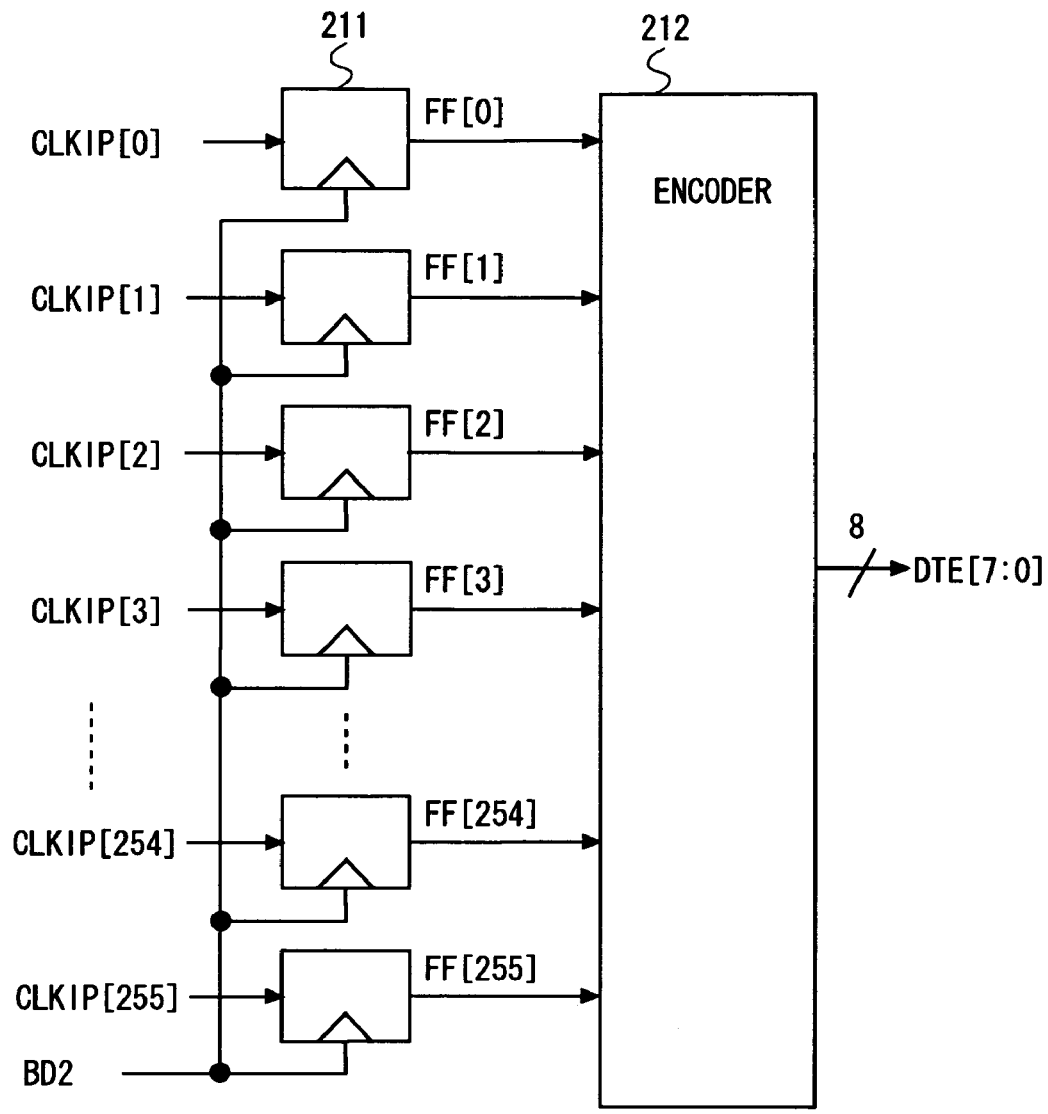
FIG. 6 is a block diagram illustrating a configuration example of the first synchronization determination circuit in the second embodiment.
Figure 7:
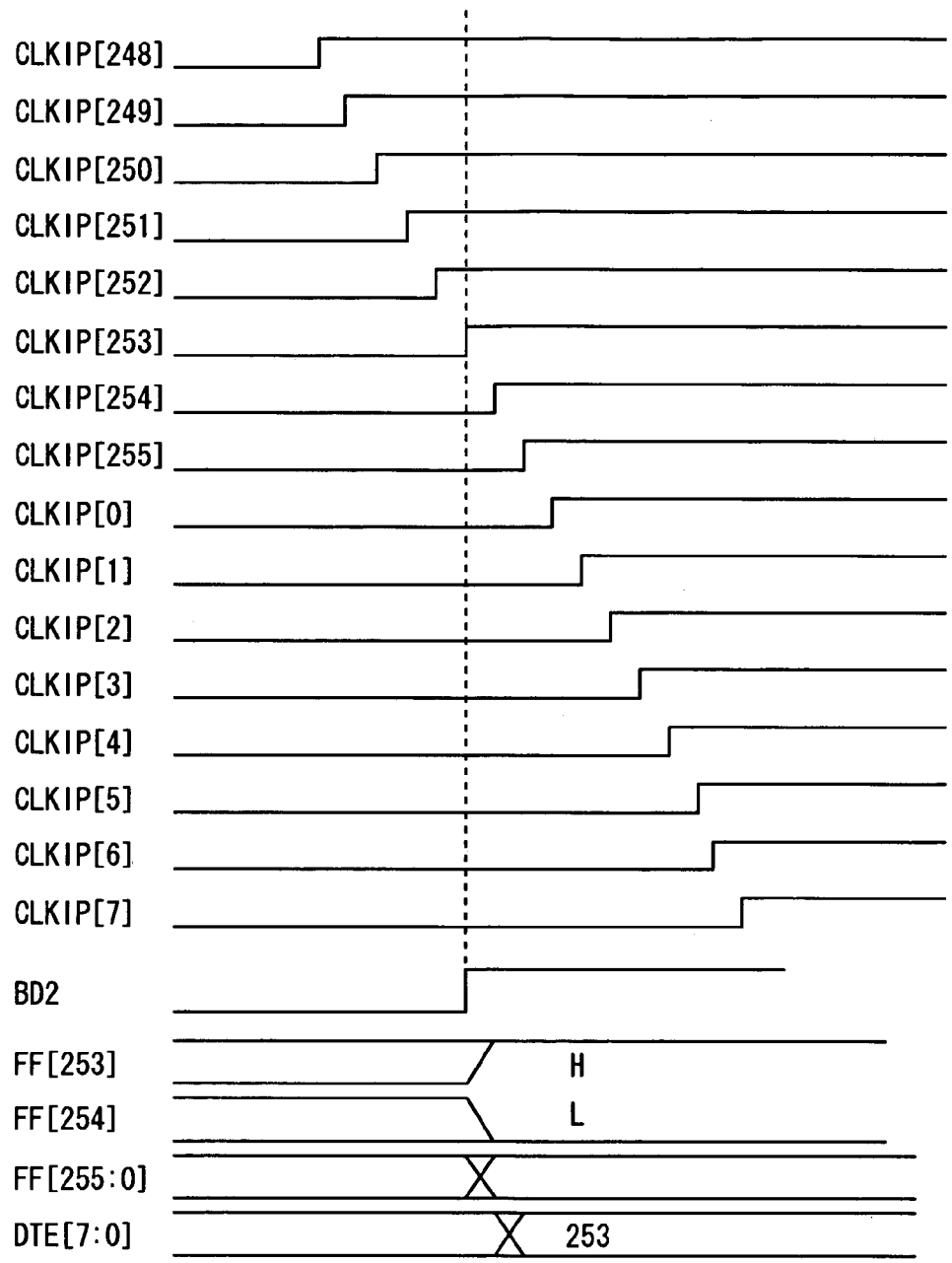
FIG. 7 is a timing chart of the first synchronization determination circuit in the second embodiment.

The configuration example of the first synchronization determination circuit 201 will be explained below with reference to FIG. 6. The timing chart of the first synchronization determination circuit 201 is shown in FIG. 7. In this case, and example of selecting CLKIP[253] is considered. The first synchronization determination circuit 201 comprises a flip-flop group 211 comprising a plurality of flip-flops (in the present example, 256), and an encoder 212 for generating a 8-bit signal DTE in response to the output signal FF of the flip-flop group 211. Respective multiphase clock signals CLKIP and a reference signal BD2 serving as clock signals are inputted in respective flip-flops of the flip-flop group 211.

As shown in FIG. 7, the output signal FF of the flip-flop group 211 changes at the rise of BD2. The output of the flip-flop (FF[253]) inputting a clock signal with a phase matching (synchronized with) that of the reference signal BD2, among the multiphase clock signals CLKIP, becomes H. The output of the flip-flop (FF[254]) after the flip-flop (FF[253]) becomes L. Thus, a bit pattern of "H" "L" is generated by the output signals of the flip-flop inputting a clock signal synchronized with the reference signal BD2 and the flip-flop located thereafter.

The encoder 212 detects this bit pattern, determines which clock signal matches the phase of the reference signal BD2, and encodes the result into 8-bit data. In the present example, CLKIP[253] is determined as matching the phase of BD2, and 253, which is the suffix of CLKIP[253], is encoded as 8-bit and outputted.

Embodiment 3

Figure 8:
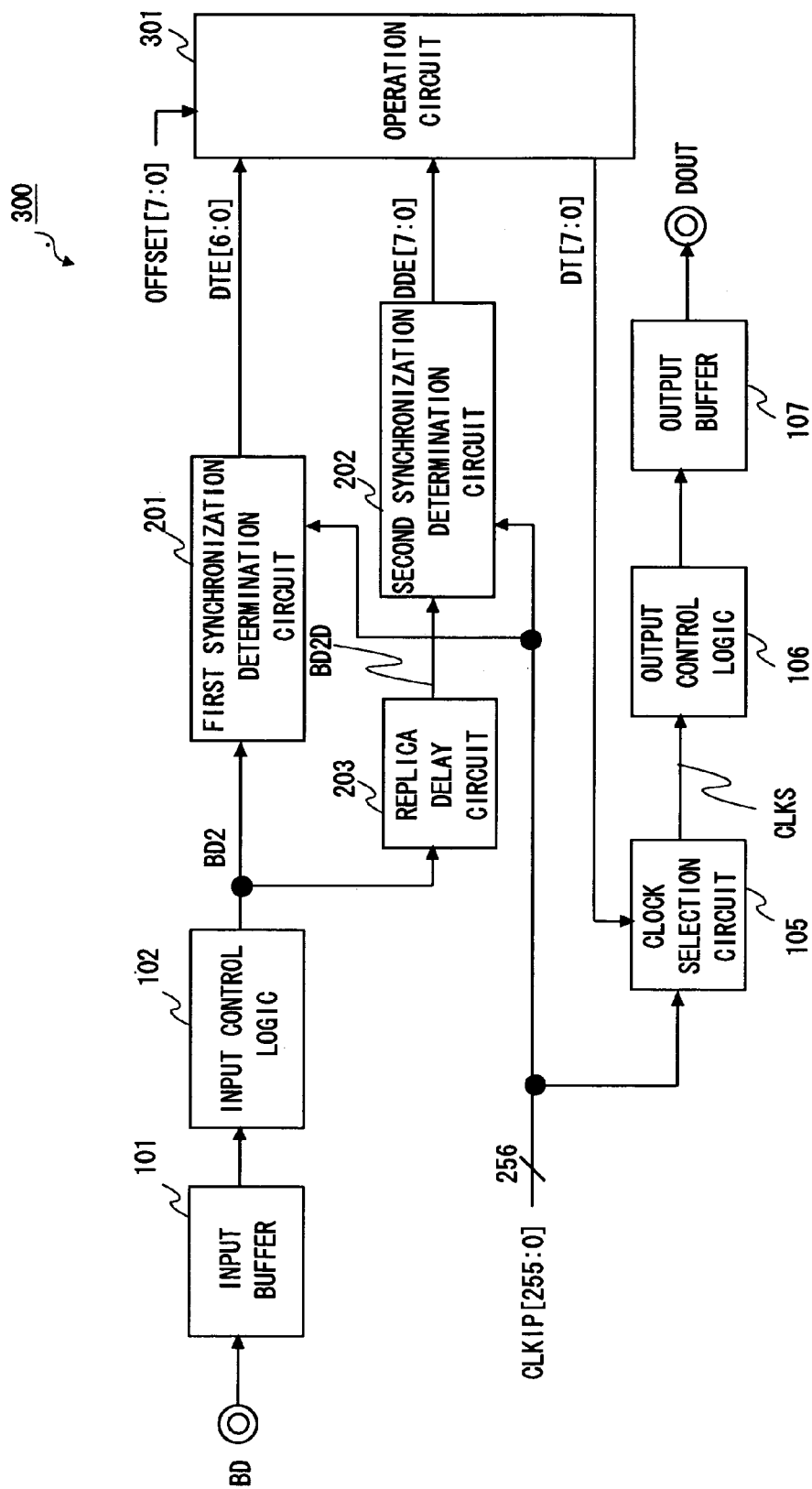
FIG. 8 is a block diagram illustrating a general configuration of a phase synchronous circuit of another embodiment.

FIG. 8 is a block diagram illustrating a general configuration of a phase synchronous circuit 300 of another embodiment. The phase synchronous circuit 300 has the configuration of the phase synchronous circuit 200 explained in Embodiment 2, wherein a operation circuit 301 has a function of adjusting the phase synchronization offset. In other aspects, it is identical to the phase synchronous circuit 200. The computation processing in the operation circuit 301 is conducted as follows: (DT=DTE−(DDE−DTE)+OFFSET=2*DTE−DDE+OFFSET). The phase synchronization position can be adjusted by supplying OFFSET from an external or internal circuit. Further, DTE is increased by a factor of two with the operation circuit 301 and because the carry is omitted, the input to the operation circuit 301 may be [6:0] and one input terminal of the operation circuit 301 is cancelled.

Figure 9:
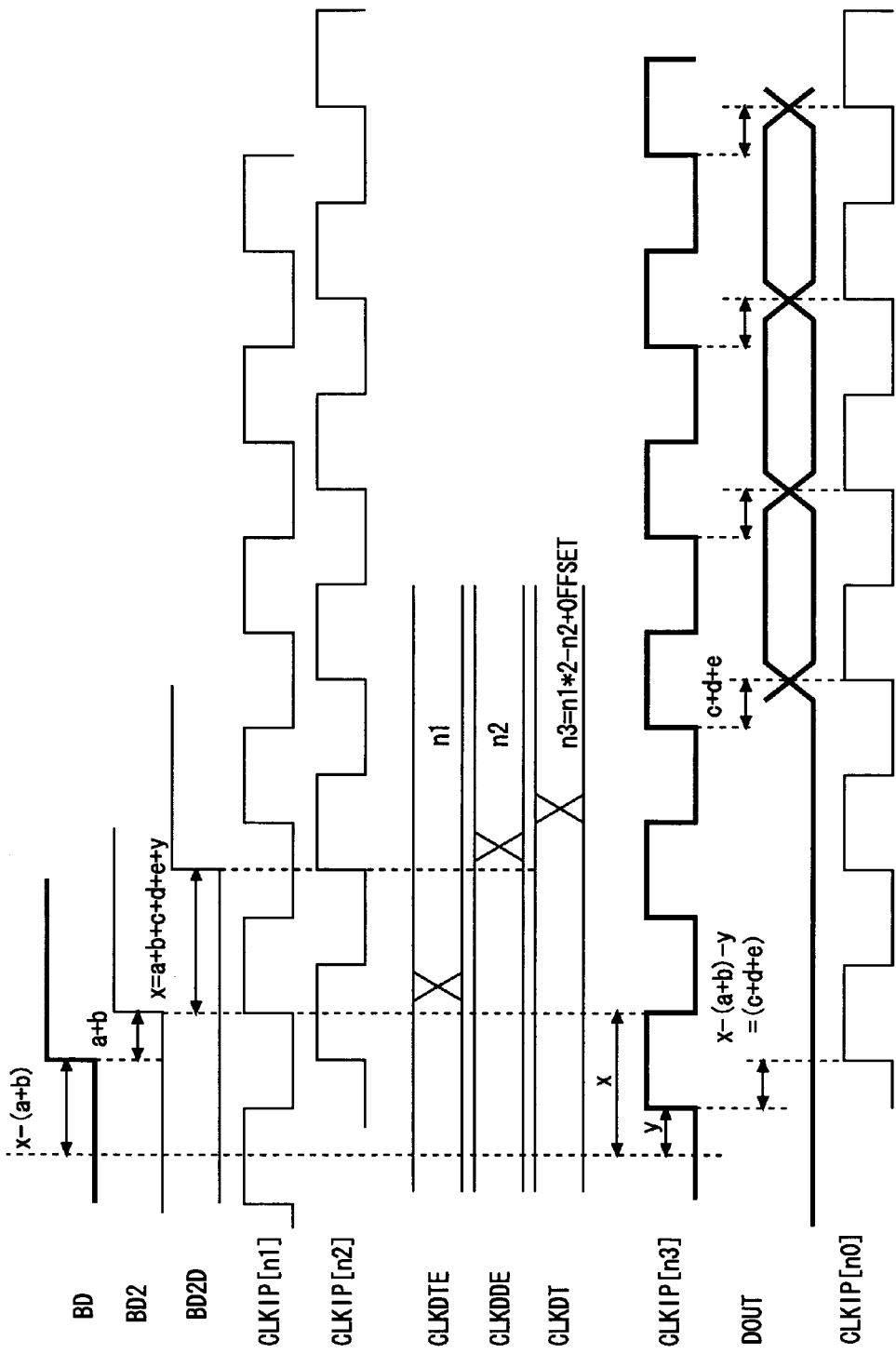
FIG. 9 is a timing chart of the phase synchronous circuit in the other embodiment.

FIG. 9 is a timing chart of the phase synchronous circuit 300. A delay error, y, is added to the delay time, x, of the replica delay circuit 203. When the fluctuation of external factors such as a through rate of input signals or output addition capacity is large, a highly accurate replica delay circuit is sometimes difficult to configure. In such cases, a delay error, y, appears in the delay time of the replica delay circuit 203. As shown in FIG. 9, the value of OFFSET of the operation circuit 301 is set to compensate the delay error y. More specifically, the following relationship is satisfied: y=period/(number of multiphase clocks)×OFFSET. In other aspects this timing chart is identical to that explained in Embodiment 2.

As follows from the computation formulas, CKLIP[n3] advances by the time obtained by deducting OFFSET from the phase difference between CKLIP[n2], CKLIP[n1] and CKLIP[n1] (delay by OFFSET). Because the time of the phase difference of CKLIP[n2] and CKLIP[n1] is x, CKLIP [n2] advances by x=(a+b+c+d+e+y) with respect to the CKLIP[n1]. CKLIP[n1] is delayed by the time (a+b) with respect to the inputted reference signal BD.

Therefore, CKLIP[n3] leads the reference signal BD by the time obtained by deducting OFFSET from (c+d+e+y). Here, because the OFFSET has a value compensating the delay error y, CKLIP[n3] leads the reference signal BD by the dime (c+d+e) and the necessary conditions is satisfied. Thus setting OFFSET to an adequate value makes it possible to compensate for the error in the phase synchronous circuit 300. Alternatively, synchronization provided with an offset such as a 45°-shift or 90°-shift also can be easily realized.

Figure 10:
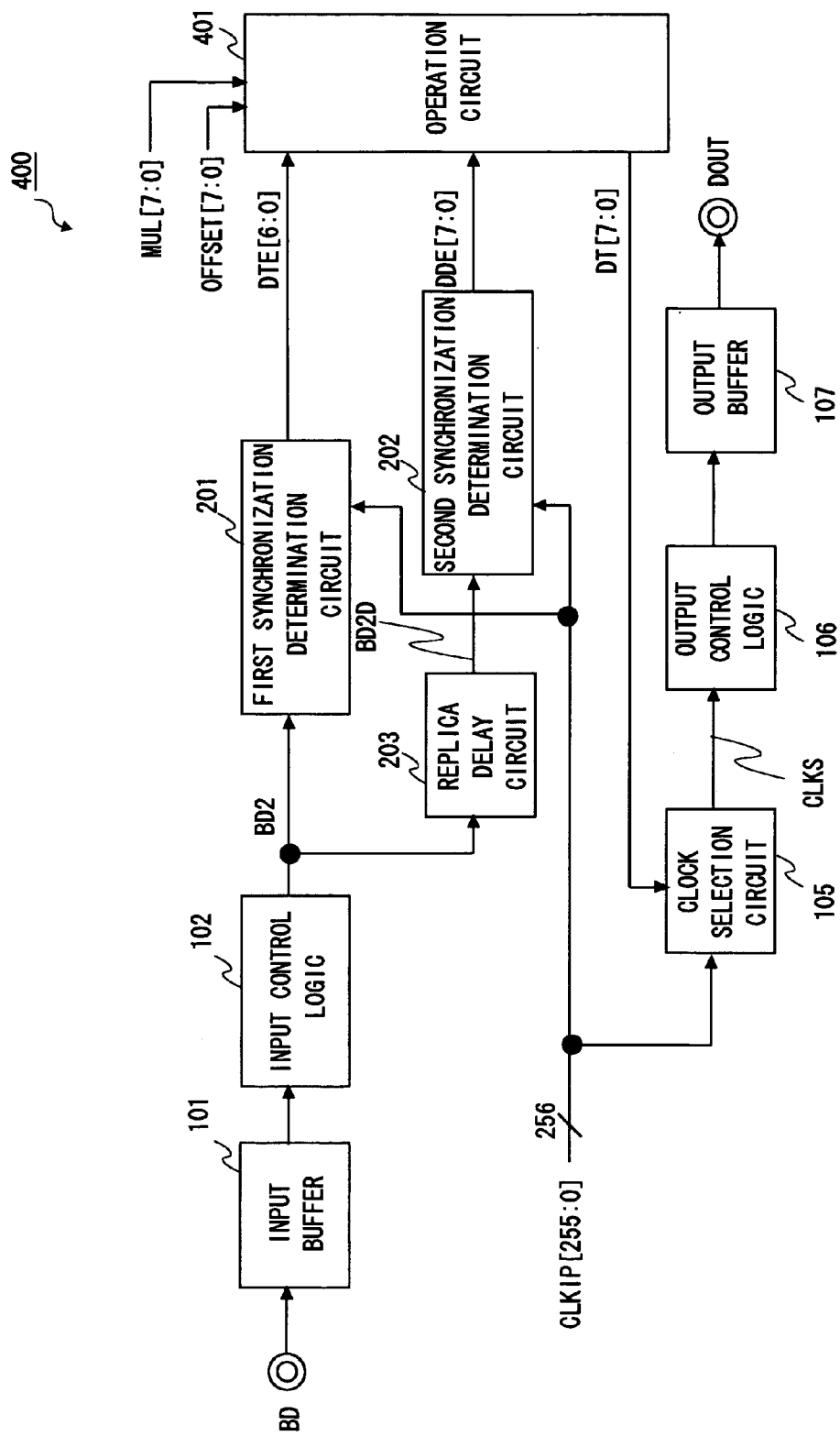
FIG. 10 is a block diagram illustrating a general configuration of a phase synchronous circuit comprising a operation circuit with improved correction function in another embodiment.

FIG. 10 shows a phase synchronous circuit 400 comprising a operation circuit 401 with improved correction function of the operation circuit 301 shown in FIG. 8. The computation formula of the operation circuit 401 is represented by (DT=DTE−(DDE−DTE)×MUL+OFFSET. The phase synchronization position is adjusted by multiplying the replica delay time (DDE−DTE) produced by the replica delay circuit 203 by MUL. MUL is not required to be an integer.

MUL can be used together with OFFSET for adjusting the phase synchronization position by supplying it from the outside as a variable value. Alternatively it can be set as a fixed value in the operation circuit 401. For example, setting MUL=2 makes it possible to reduce the delay time of the replica delay circuit 203 by half. As a result, the surface area of the replica delay circuit 203 can be reduced. Further, it is not necessary to use UL together with OFFSET.

Other Embodiments

Figure 11:
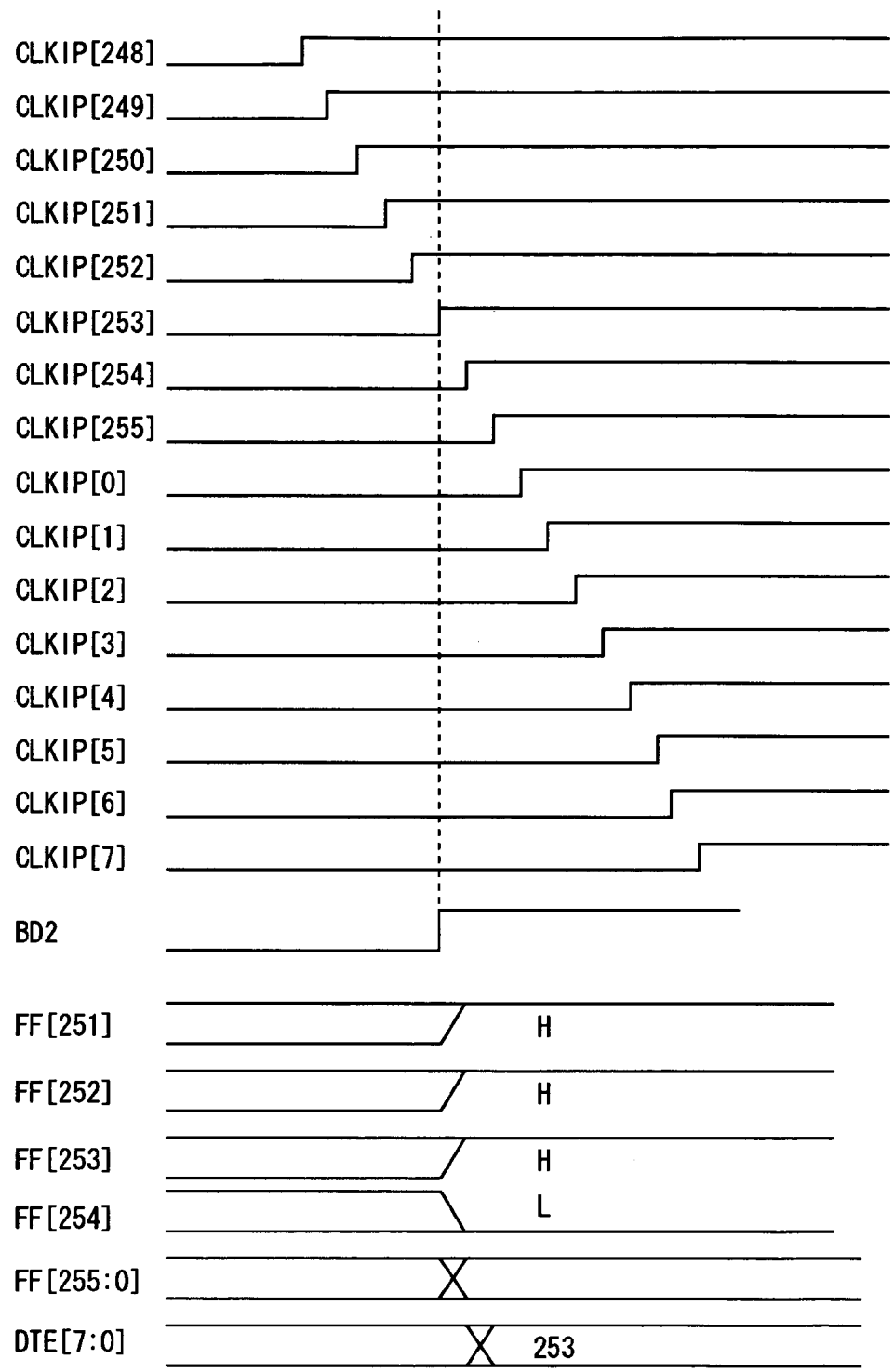
FIG. 11 is a timing chart for explaining another configuration example of the first synchronization determination circuit.

FIG. 11 is a timing chart for explaining another configuration example of the first phase synchronous circuit 201 explained in Embodiment 2. FIG. 11 shows an example in which the clock signal CLKIP[253] is synchronized with the reference signal BD2. The configuration of the flip-flop section 211 in this example is identical to that explained above. In the present example, the encoding processing of the encoder 212 differs from that of the above-described example. In the present example, the encoder 212 determines the synchronization clock signal by detecting bit patterns of 3 bits or more.

In the example shown in FIG. 11, the encoder 212 determines the synchronization signal by a bit pattern of four bits. In the present example, the clock signal CLKIP[253] is synchronized with the reference signal BD2, but the encoder 212 determines the synchronized clock signal based on the output FF[251:254] of the flip-flop. FF[251:254] are at a H level, and FF [254] is at a L level. Therefore, BD2 is determined as synchronized with CLKIP[253] by detecting a pattern of four bits of "H, H, H, L". Thus discriminating a synchronized clock signal by a bit pattern of three or more bits makes is possible to determine a synchronized clock signal accurately even when a bit pattern of "H, L" is outputted from an unexpected flip-flop due to a spread between flip-flops.

Figure 12:
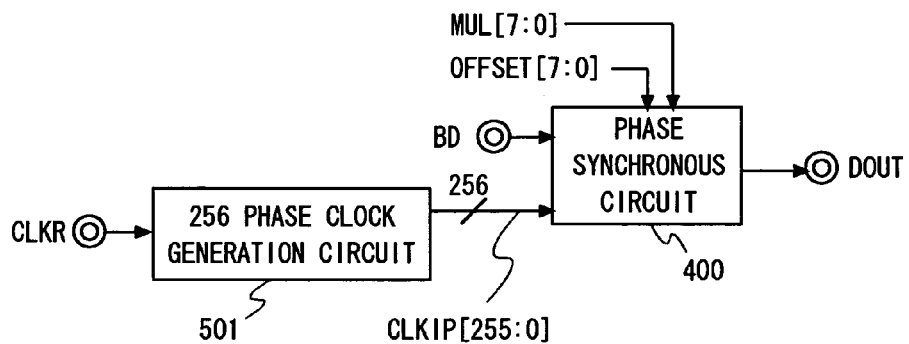
FIG. 12 is a block diagram illustrating a circuit configuration in which a multiphase clock signal generation circuit is added to the phase synchronous circuit in accordance with the present invention.
Figure 13:
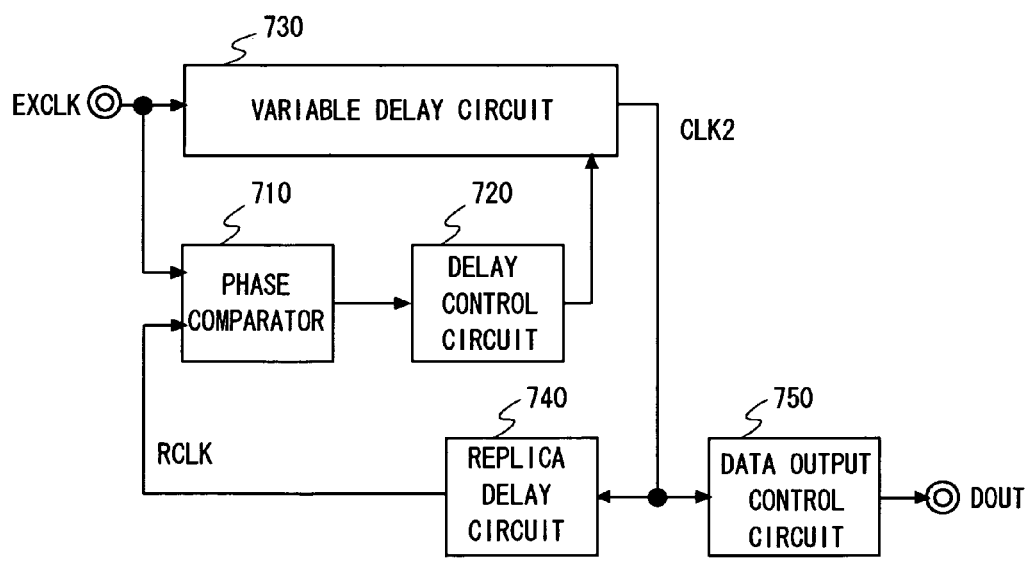
FIG. 13 is a circuit diagram illustrating a general configuration of the phase synchronous circuit according to the conventional technology.
Figure 14:
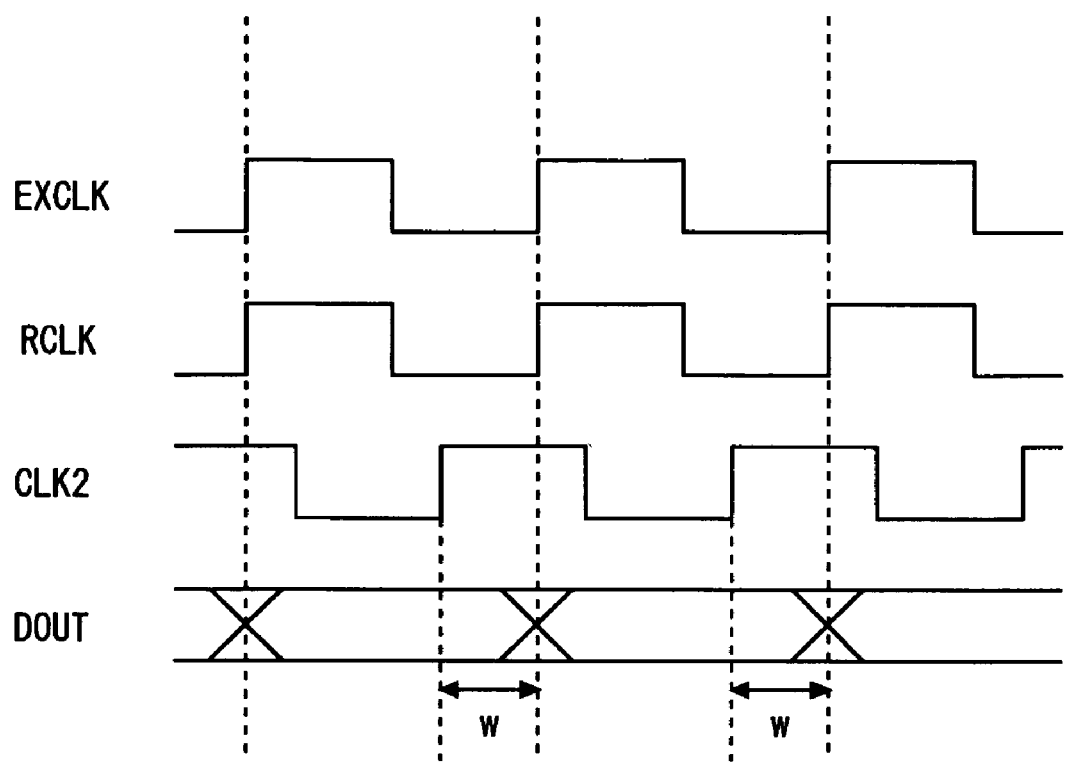
FIG. 14 is a timing chart of the phase synchronous circuit according to the conventional technology.

Finally, FIG. 12 shows a circuit configuration in which a multiphase clock signal generation circuit 501 is added to the phase synchronous circuit 400 in accordance with the present invention. The multiphase clock signal generation circuit 501 can have a well-known circuit configuration and the explanation thereof is herein omitted. The multiphase clock signal generation circuit 501 outputs a multiphase clock signal CLKIP synchronously with a one-phase clock CLKR. The configuration and operation of the phase synchronous circuit 400 are as described hereinabove. As a result, it is possible to output an output signal DOUT synchronized with the reference signal BD when the one-phase clock CLKR is inputted.

It is apparent that the present invention is not limited to the above embodiment and it may be modified and changed without departing from the scope and spirit of the invention.

What is claimed is:

1. A phase synchronous circuit generating an output signal synchronized with an input signal, comprising:
   an output circuit putting out an output signal according to an input clock signal; and
   a selection circuit selecting a clock signal applied to the output circuit from multiphase clock signals such that the output circuit puts out the output signal synchronized with the input signal,
   wherein the clock signal applied to the output circuit leads timing synchronized with the input signal by a delay time of the output circuit.

2. The phase synchronous circuit of claim 1, further comprising:
   a first phase determination circuit comparing a reference signal according to the input signal and multiphase clock signals to determine a first synchronous clock signal;
   a replica delay circuit providing a delay reference signal which lags the reference signal;
   a second phase determination circuit comparing the delay reference signal and the multiphase clock signals to determine a second synchronous clock signal; and
   a clock signal determination circuit determining a clock signal from the multiphase clock signals based on comparison results of the first and second phase determination circuits,
   wherein the selection circuit selects a clock signal based on the determination of the clock signal determination circuit.

3. The phase synchronous circuit of claim 2, wherein a delay of the replica delay circuit compensates for a delay of the selection circuit and the output circuit.

4. The phase synchronous circuit of claim 3, further comprising an input circuit receiving the input signal, wherein the delay of the replica delay circuit compensates for delay of the input circuit.

5. The phase synchronous circuit of claim 2, wherein the clock signal determination circuit adjusts a phase synchronization offset.

6. The phase synchronous circuit of claim 5, wherein the clock signal determination circuit adjusts a phase synchronization position using a multiplication value of a delay time of the replica delay circuit.

7. The phase synchronous circuit of claim 2, wherein suffixes are defined for identifying the multiphase clock signals respectively, and the clock signal determination circuit determines the clock signal based on suffixes of the first synchronous clock signal and the second synchronous clock signal.

8. A phase synchronous circuit generating an output signal synchronized with an input signal, comprising:
- an output circuit putting out an output signal according to an input clock signal;
- a selection circuit selecting a clock signal applied to the output circuit from multiphase clock signals such that the output circuit puts out the output signal synchronized with the input signal;
- a first phase determination circuit comparing a reference signal according to the input signal and multiphase clock signals to determine a first synchronous clock signal;
- a replica delay circuit providing a delay reference signal which lags the reference signal;
- a second phase determination circuit comparing the delay reference signal and the multiphase clock signals to determine a second synchronous clock signal; and
- a clock signal determination circuit determining a clock signal from the multiphase clock signals based on comparison results of the first and second phase determination circuits,
- wherein the selection circuit selects a clock signal based on the determination of the clock signal determination circuit.

9. The phase synchronous circuit of claim 8, wherein a delay of the replica delay circuit compensates for a delay of the selection circuit and the output circuit.

10. The phase synchronous circuit of claim 9, further comprising an input circuit receiving the input signal, wherein the delay of the replica delay circuit compensates for a delay of the input circuit.

11. The phase synchronous circuit of claim 8, wherein the clock signal determination circuit adjusts a phase synchronization offset.

12. The phase synchronous circuit of claim 11, wherein the clock signal determination circuit adjusts a phase synchronization position using a multiplication value of a delay time of the replica delay circuit.

13. The phase synchronous circuit of claim 8, wherein the clock signal determination circuit adjusts a phase synchronization position using a multiplication value of a delay time of the replica delay circuit.

14. The phase synchronous circuit of claim 8, wherein suffixes are defined for identifying the multiphase clock signals respectively, and the clock signal determination circuit determines the clock signal based on suffixes of the first synchronous clock signal and the second synchronous clock signal.

15. A phase synchronous circuit generating an output signal synchronized with an input signal, comprising:
- an output circuit putting out an output signal according to an input clock signal; and
- a selection circuit selecting a clock signal applied to the output circuit from multiphase clock signals such that the output circuit puts out the output signal synchronized with the input signal,
- wherein the selection circuit selects a clock signal which leads a timing synchronized with the input signal by a delay time of the selection circuit and the output circuit.

* * * * *